(12) United States Patent
Ouyang et al.

(10) Patent No.: US 11,914,247 B2
(45) Date of Patent: Feb. 27, 2024

(54) BACKLIGHT MODULE AND DISPLAY SCREEN

(71) Applicant: Huawei Technologies Co., Ltd., Shenzhen (CN)

(72) Inventors: Shihong Ouyang, Shenzhen (CN); Yiwen Chang, Dongguan (CN)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 18/324,522

(22) Filed: May 26, 2023

(65) Prior Publication Data
US 2023/0305332 A1  Sep. 28, 2023

Related U.S. Application Data

(63) Continuation of application No. PCT/CN2021/133915, filed on Nov. 29, 2021.

(30) Foreign Application Priority Data

Nov. 30, 2020 (CN) .......................... 202011384672.9

(51) Int. Cl.
*G02F 1/13357* (2006.01)

(52) U.S. Cl.
CPC .. *G02F 1/133605* (2013.01); *G02F 1/133603* (2013.01); *G02F 1/133606* (2013.01)

(58) Field of Classification Search
CPC ......... G02F 1/133605; G02F 1/133603; G02F 1/133606

USPC .......................................................... 362/97.3
See application file for complete search history.

(56) References Cited

U.S. PATENT DOCUMENTS 8,297,786 B2 * 10/2012 Shani ................. G02B 19/0066
362/97.3
2015/0168783 A1 * 6/2015 Chang ............... G02F 1/133603
362/97.3

FOREIGN PATENT DOCUMENTS

CN          110646983      *  3/2020
KR          1020190087069  *  7/2019

* cited by examiner

*Primary Examiner* — Laura K Tso
(74) *Attorney, Agent, or Firm* — Slater Matsil, LLP

(57) ABSTRACT

A backlight module includes a substrate and light source assemblies. The substrate has a plurality of light emitting regions, and the plurality of light emitting regions are arranged in an array. A plurality of light source assemblies are disposed in the plurality of light emitting regions in a one-to-one correspondence. Each light source assembly includes a plurality of light source members arranged in an array. Each light source member includes a light emitting unit, and a reflective film configured to split light emitted by the light emitting unit. When the reflective film is disposed, the following condition needs to be met: A proportion of light split by the reflective film towards a center of the light emitting region gradually increases in a direction from the center to an edge of the light emitting region in which the light source member is located.

20 Claims, 7 Drawing Sheets

BACKLIGHT MODULE AND DISPLAY SCREEN

CROSS-REFERENCE TO RELATED APPLICATIONS

This application is a continuation of International Application No. PCT/CN2021/133915, filed on Nov. 29, 2021, which claims priority to Chinese Patent Application No. 202011384672.9, filed on Nov. 30, 2020. The disclosures of the aforementioned applications are hereby incorporated by reference in their entireties.

TECHNICAL FIELD

This application relates to the field of display apparatus technologies, and in particular, to a backlight module and a display screen.

BACKGROUND

When a liquid crystal display works, a liquid crystal material itself does not emit light, and needs to rely on a passive light source. The light source needs to be illuminated to a liquid crystal panel from a rear surface, and light emitting output is controlled to form an image. Currently, a mainstream liquid crystal backlight technology in the market uses a light emitting diode as the light source, and a mainstream structure uses a side-type backlight module and a direct-type backlight module.

The side-type backlight module places the light source on a side surface of the module. After light is incident from the side surface, the light passes through a light guide plate. The light is scattered by using the light guide plate, and the light is gradually coupled and emitted uniformly to form a surface light source. The side-type backlight module has an advantage of lightness and thinness. However, all light sources need to be always turned on to ensure uniform light emission, and light emission of the light source cannot be adjusted based on brightness of an image region.

The direct-type backlight module directly places the light source below a panel. Light sources are uniformly arranged in an array. Light is directly incident from below the display panel to the display panel, to form uniform illumination on the display panel. In addition, the light source of the backlight module is directly located below the display panel. Therefore, brightness degrees of different light sources may be controlled based on a brightness degree of a displayed image. However, because a diffusion range of the light source is relatively wide, a large-range halo is formed when a single region on the display panel is lit. Such a halo causes an obvious halo when a highlighted object is displayed in a black background. This reduces local display comparison effect.

As people's life quality improves, there is a higher display requirement on the liquid crystal display. However, neither of the existing two backlight modules can ensure good image region display comparison effect.

SUMMARY

This application provides a backlight module and a display screen, to improve light emitting effect of the backlight module and to provide display effect of the display screen.

According to a first aspect, a backlight module is provided. The backlight module is applied to a display apparatus, and is configured to provide light to the display apparatus. The backlight module includes a substrate and light source assemblies. The substrate has a plurality of light emitting regions, and the plurality of light emitting regions are arranged in an array. There are a plurality of light source assemblies, and the plurality of light source assemblies are disposed in the plurality of light emitting regions in a one-to-one correspondence. Each light source assembly includes a plurality of light source members arranged in an array. Each light source member includes a light emitting unit, and a reflective film configured to split light emitted by the light emitting unit. When the reflective film is disposed, the following condition needs to be met: A proportion of light split by the reflective film towards a center of the light emitting region gradually increases in a direction from the center to an edge of the light emitting region in which the light source member is located. In this way, light emitted by the light source assembly has good light mixing effect in the light emitting region. This improves light emitting effect of the backlight module. In addition, light splitting is performed by using the reflective film, facilitating miniaturization of the backlight module.

In a specific implementation solution, the reflective film is located on a light emitting side of the corresponding light emitting unit, and the reflective film faces a top light emitting surface of the light emitting unit, and is configured to split light emitted from a top of the light emitting unit. The light emitted from the top of the light emitting unit is mixed by using the reflective film.

In a specific implementation solution, the reflective film is a tapered surface, a tapered tip of the reflective film faces the top light emitting surface of the corresponding light emitting unit, and a distance between a center line of the corresponding light emitting unit and a straight line in which the tapered tip of the reflective film is located and that is perpendicular to the light emitting unit gradually increases in a direction away from the center of the light emitting region. The center line of the light emitting unit is a straight line that runs through the center of the light emitting unit in a thickness direction of the substrate. The tapered surface is used to split light.

In a specific implementation solution, the tapered surface is a different tapered surface, such as a cone tapered surface, a triangular pyramid surface, and a rectangular pyramid surface. Different tapered surfaces can be selected for light splitting.

In a specific implementation solution, if a distance between a center line of the light emitting region and the straight line in which the tapered tip of the reflective film is located and that runs through the substrate in the thickness direction of the substrate is a first distance, and a distance between the center line of the light emitting region and the center line of the light emitting unit corresponding to the reflective film is a second distance, the first distance is greater than the second distance. The center line of the light emitting region is a straight line that runs through the center of the light emitting region in the thickness direction of the substrate. The proportion of split light of the light emitting unit is improved by setting a shape of the tapered surface.

In a specific implementation solution, a connection line between a projection of the tapered tip of the reflective film in a first plane and a projection of the center of the light emitting region in the first plane is a first connection line. The center line of the light emitting unit corresponding to the reflective film intersects with the first connection line, and the first plane is parallel to a surface of the substrate. This improves a light splitting effect.

In a specific implementation solution, a plurality of light transmission holes are provided in the reflective film. The light transmission holes can improve a light splitting effect.

In a specific implementation solution, the plurality of light transmission holes are uniformly arranged in the reflective film. This improves a light splitting effect.

In a specific implementation solution, the reflective film is bonded to the top light emitting surface of the light emitting unit by using a transparent adhesive. In this way, the reflective film is relatively fastened to the light emitting unit.

In a specific implementation solution, each light source member further includes a flat layer that covers the reflective film. This facilitates processing of the light source member.

In a specific implementation solution, the flat layer is a transparent structure, and the reflective film is a plating layer disposed on the flat layer.

In a specific implementation solution, the flat layer is a reflective white adhesive, and the reflective film is a surface of the reflective white adhesive that faces the corresponding light emitting unit.

In a specific implementation solution, the backlight module further includes a diffusion film and a prism brightness enhancement film. The diffusion film and the prism brightness enhancement film are disposed in a stacked manner, and the diffusion film is closer to the plurality of light source assemblies than the prism brightness enhancement film. This further improves a light mixing effect of the backlight module.

In a specific implementation solution, each light emitting region is in a one-to-one correspondence with a display region of a display screen. This improves display effect of the display apparatus.

According to a second aspect, a display screen is provided. The display screen includes the backlight module according to any one of the foregoing description, and a liquid crystal layer and the backlight module are stacked. Light splitting is performed by using a reflective film. A proportion of light split by the reflective film towards a center of a light emitting region gradually increases in a direction from the center to an edge of the light emitting region in which a light source member is located. In this way, light emitted by the light source assembly has good light mixing effect in the light emitting region. This improves light emitting effect of the backlight module. In addition, light splitting is performed by using the reflective film, facilitating miniaturization of the backlight module.

DETAILED DESCRIPTION OF ILLUSTRATIVE EMBODIMENTS

The following further describes embodiments of this application with reference to the accompanying drawings.

Figure 1:
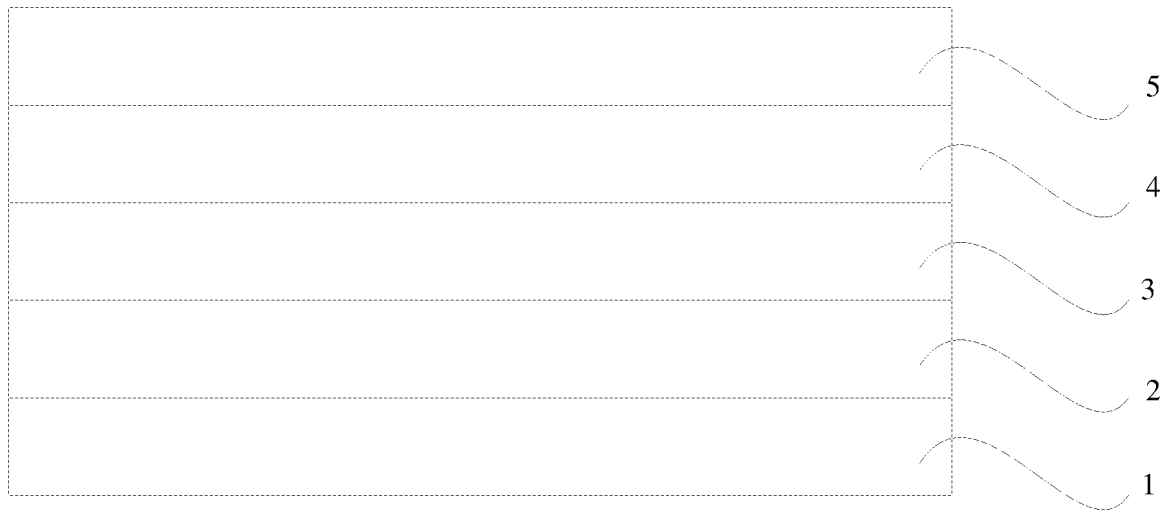
FIG. 1 is a schematic diagram of a structure of a display apparatus.

For ease of understanding of a backlight module provided in embodiments of this application, an application scenario of the backlight module in this application is first described. The backlight module is applied to a display apparatus, and is configured to provide light to the display apparatus for display. As shown in FIG. 1, the display apparatus includes a backlight module 1, a polarizer 2, a drive control circuit 3, a display layer 4, and a color filter 5. The backlight module 1 provides a uniform white light surface light source to the display apparatus. The polarizer 2 adjusts a polarization state of light emitted by the backlight module to a specific linear polarization state. The drive control circuit 3 controls a voltage signal to deflect a liquid crystal material molecule in the display layer 4, so that a polarization direction of incident light is changed. The color filter 5 changes a light color of a pixel.

Figure 2:
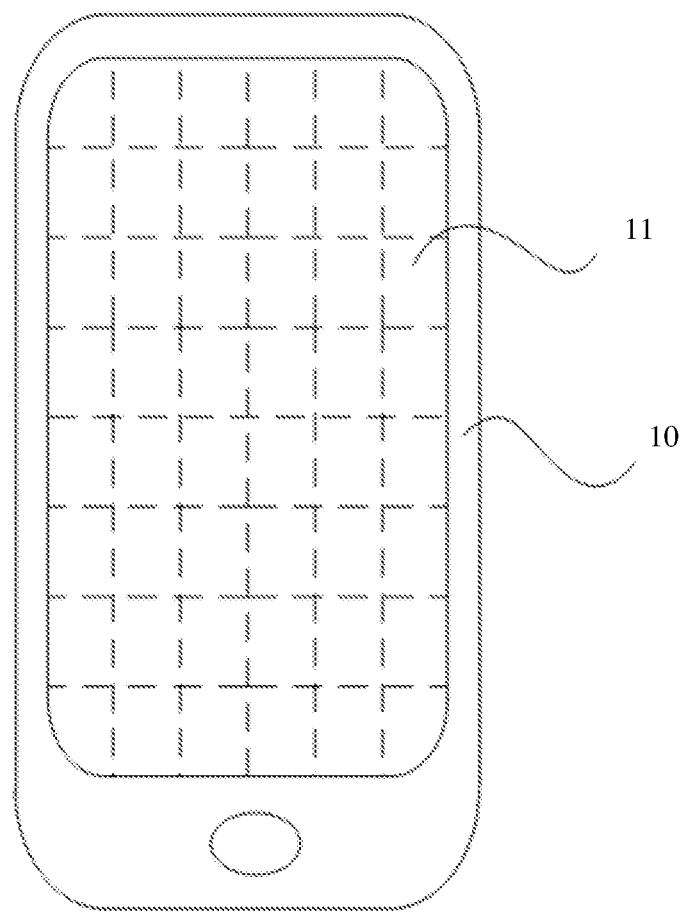
FIG. 2 is a schematic diagram of a structure of a display panel of a display apparatus.

FIG. 2 is a schematic diagram of a structure of a display panel of a display apparatus. When a display layer 10 performs display, the display layer 10 may be divided into different display regions based on a displayed image. For example, each pixel is one display region 11, or a plurality of pixels form one display region 11. FIG. 2 shows an example of a manner of arranging a plurality of display regions 11 in an array. However, it should be understood that FIG. 2 shows only a specific example of division of the display region 11. Different display regions may be obtained by division based on the displayed image. When the image is displayed, light varies with different display regions 11. To improve image region display comparison effect when the display apparatus displays the image and to improve display effect of the display apparatus, interference between light that passes through the different display regions needs to be reduced as much as possible. However, neither a direct-type backlight module nor a side-type backlight module provided in the conventional technology can provide good light. Therefore, embodiments of this application provide a backlight module, to provide comparison effect of an image region of the display apparatus. The following describes the backlight module in detail with reference to the specific accompanying drawings and embodiments.

Figure 3:
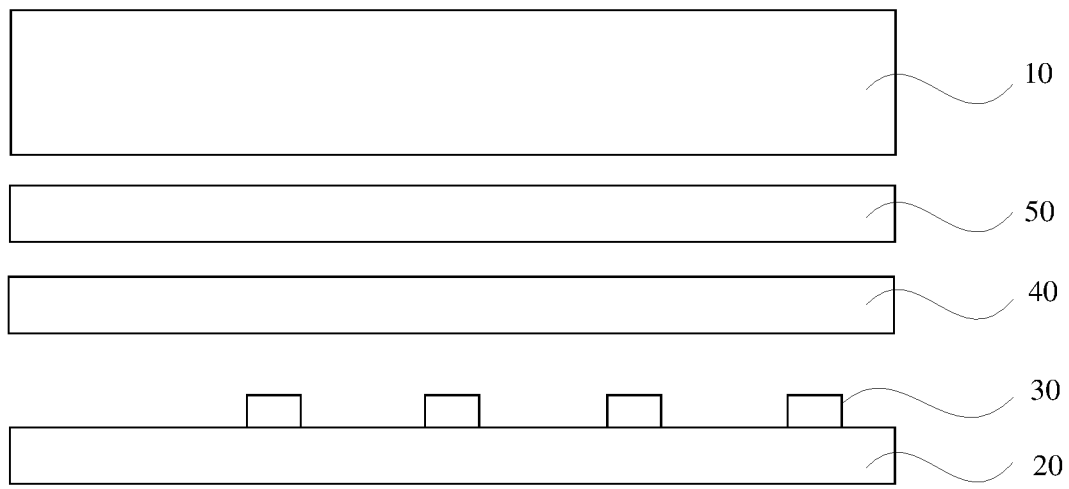
FIG. 3 is a schematic diagram of a structure of a backlight module according to an embodiment of this application.

FIG. 3 is a schematic diagram of a structure of a backlight module according to an embodiment of this application. The backlight module provided in this embodiment of this application is a direct-type backlight module. The direct-type backlight module includes components, such as a substrate 20, an LED (Light Emitting Diode) light source array 30, a diffusion film 40, and a prism brightness enhancement film 50. The diffusion film 40 is closer to the light source array 30 than the prism brightness enhancement film 50.

The substrate 20 is configured to bear the LED light source array 30 and supply power to the LED light source array 30. The LED light source array 30 is configured to provide light to a display layer 10, so that the display layer 10 emits light for display. The diffusion film 40 further implements light homogenization, and improves a light mixing effect. The prism brightness enhancement film 50 improves forward brightness of light (the forward means a direction in which the backlight module points to the display layer 10), to provide a uniform white light surface light source to the display layer 10.

It should be understood that in this embodiment of this application, the diffusion film 40 and the prism brightness enhancement film 50 are optional film layers. The diffusion film 40 or the prism brightness enhancement film 50 may be selectively disposed, based on a light mixing requirement, in the backlight module provided in this embodiment of this application. Certainly, in addition to the diffusion film 40 or the prism brightness enhancement film 50, the backlight module may further select another conventional layer structure based on a requirement, which is not illustrated one by one in this embodiment of this application.

Figure 4:
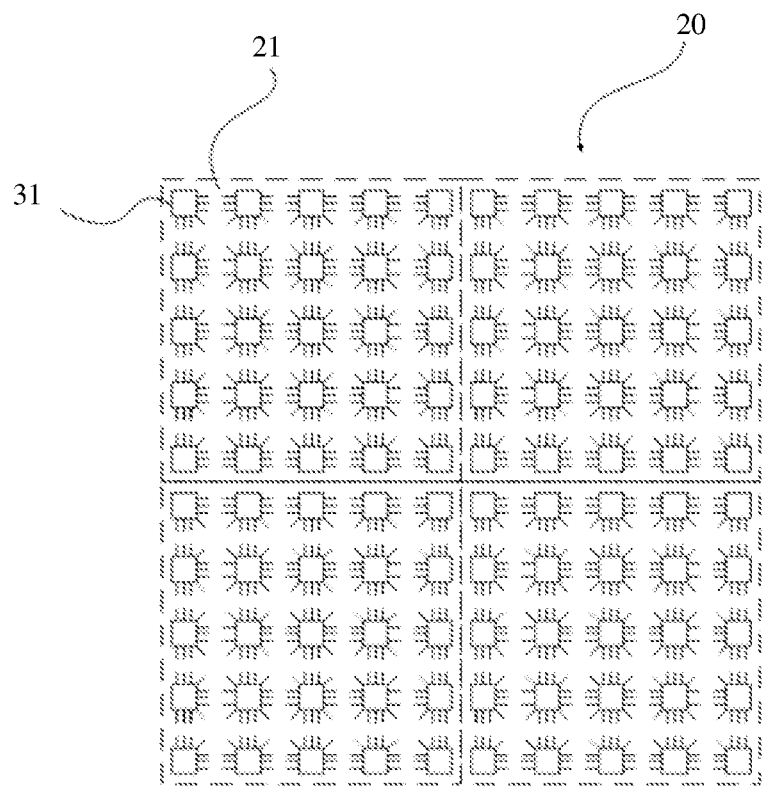
FIG. 4 is a schematic diagram of a structure of an LED light source array according to an embodiment of this application.

FIG. 4 is a schematic diagram of a structure of an LED light source array. Based on the division of different regions in the display layer shown in FIG. 2, region division is also performed in a backlight module. A substrate 20 may be divided into a plurality of light emitting regions 21. The plurality of light emitting regions 21 are arranged in an array and are in a one-to-one correspondence with display regions of a display screen, to correspondingly provide light to each display region.

When the substrate 20 is divided into the plurality of light emitting regions 21, a corresponding LED light source array is also divided. The LED light source array is divided into a plurality of light source assemblies. The plurality of light source assemblies are disposed in the plurality of light emitting regions 21 in a one-to-one correspondence. Each light source assembly includes a plurality of light source members 31. In this embodiment of this application, the plurality of light source members 31 are arranged in an array. The following uses one of the light source assemblies as an example for description.

The light source assembly includes the plurality of light source members 31 arranged in an array. To improve a light mixing effect, in this embodiment of this application, a light emitting direction of the light source member 31 is adjusted based on a position of the light source member 31. A specific adjustment solution is as follows: A light source member 31 located at a center of a light emitting region 21 emits light around, and a light source member 31 located at an edge of a light emitting region 21 emits light towards an inside of the light emitting region 21.

Refer to straight lines around a light source member 31 shown in FIG. 4. Directions indicated by the straight lines are light emitting directions corresponding to the light source member 31. A quantity of straight lines represents an amount of light emitted. It can be seen from FIG. 4 that, the light source member 31 located in the center emits light around, and the light source member 31 located at the edge of the light emitting region 21 emits light in the edge of the light emitting region 21 and towards the inside of the light emitting region 21. In addition, the light source member 31 located at the edge of the light emitting region 21 emits less light or does not emit light towards an adjacent light emitting region 21. This reduces light crosstalk between two light emitting regions 21.

Figure 5:
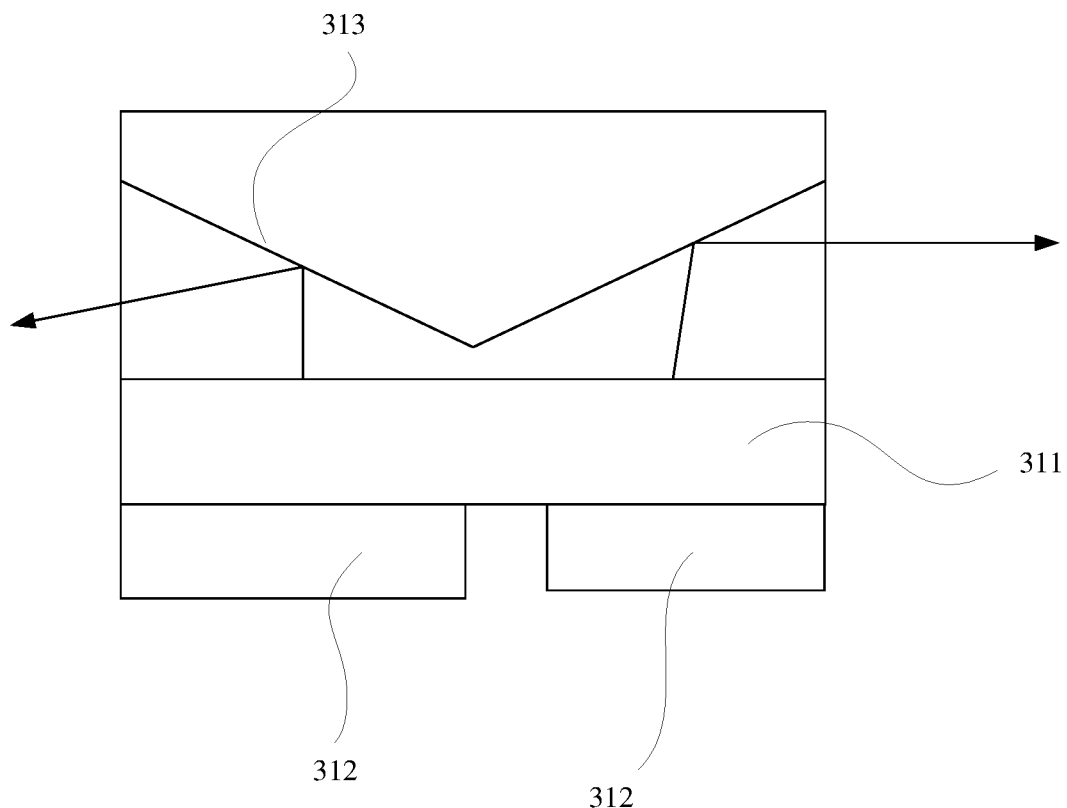
FIG. 5 is a schematic diagram of a structure of a light source member according to an embodiment of this application.

FIG. 5 is a schematic diagram of a structure of a light source member. Each light source member includes a light emitting unit 311 and a corresponding reflective film 313. The light emitting unit 311 is a flip-mounted LED light bead, and two pads 312 of the flip-mounted LED light bead are separately located at a bottom of the LED light bead and connected to a circuit layer of a substrate. When the flip-mounted LED light bead is used, the pads 312 do not occupy a top light emitting surface of the light emitting unit 311. This increases a light emitting area of the light emitting unit 311. Certainly, the light emitting unit 311 provided in this embodiment of this application may alternatively use another type of a light emitting structure. This is not specifically limited in this application.

The reflective film 313 is configured to split light emitted by the light emitting unit 311. Refer to the structure of the light emitting unit 311. When the reflective film 313 is disposed, the reflective film 313 faces the top light emitting surface of the light emitting unit 311, and is configured to split light emitted from a top of the light emitting unit 311. When splitting the light from the light emitting unit 311, the reflective film 313 has a surface that is relatively inclined to the top light emitting surface of the light emitting unit 311, so that the light emitted from the top may be reflected towards a required direction after being reflected by the reflective film 313. For straight line arrows shown in FIG. 5, the light emitted by the top light emitting surface is reflected by the reflective film 313 and then reflected around. In the conventional technology, a light source member of a direct-type backlight module diverges light emitted by a spot light source through a lens, and the lens needs a relatively large thickness size to ensure a divergence effect. In this application, light emitted by the light source member is reflected by the reflective film to achieve a light divergence effect. This greatly reduces a thickness of the light source member.

For example, the reflective film 313 is a tapered surface. A tapered tip of the reflective film 313 faces the top light emitting surface of the corresponding light emitting unit 311. The light emitted by the top light emitting surface may be reflected by the tapered surface and then emitted.

In an optional solution, the tapered surface is a different tapered surface, such as a cone tapered surface, a triangular pyramid surface, and a rectangular pyramid surface. When the reflective film 313 is specifically disposed, a different shape may be selected based on a requirement. This is not specifically limited in this embodiment of this application.

To enable a light source member located at a central position of a light emitting region to emit light uniformly around, a light source member located at an edge emits light towards an inside of the light emitting region. When a reflective film 313 of each light source member is disposed, an emission direction of reflected light is controlled by adjusting a shape of the reflective film 313. For example, a proportion of light split by the reflective film 313 towards a center of the light emitting region gradually increases in a direction from the center to an edge of the light emitting region in which the light source member is located. In this way, the light source member farther away from the center of the light emitting region splits a larger amount of light towards the center of the light emitting region, and splits a smaller amount of light towards another region.

To facilitate description of a reflection effect of the reflective film 313, a center line of the light emitting unit 311 and a center line of the light emitting region are defined. The center line of the light emitting unit 311 means a straight line that runs through the center of the light emitting unit in a thickness direction of the substrate. The center line of the light emitting unit 311 is also a center line of the light source member. The center line of the light emitting region is a straight line that runs through the center of the light emitting region in the thickness direction of the substrate.

To facilitate description of the reflective film, d and D are defined. d is a first distance between the center line of the light emitting region and a straight line in which a tapered tip of the reflective film is located and that runs through the substrate in the thickness direction of the substrate. D is a second distance between the center line of the light emitting region and the center line of the light emitting unit corresponding to the reflective film. When the reflective film is disposed, a distance between the tapered tip of the reflective film and the center line of the corresponding light emitting unit gradually increases in a direction away from the center of the light emitting region. In other words, d changes with D. The following uses five light source members shown in FIG. 6 as an example to describe a correspondence between a position of a reflective film and a position of a light source member.

Figure 6:
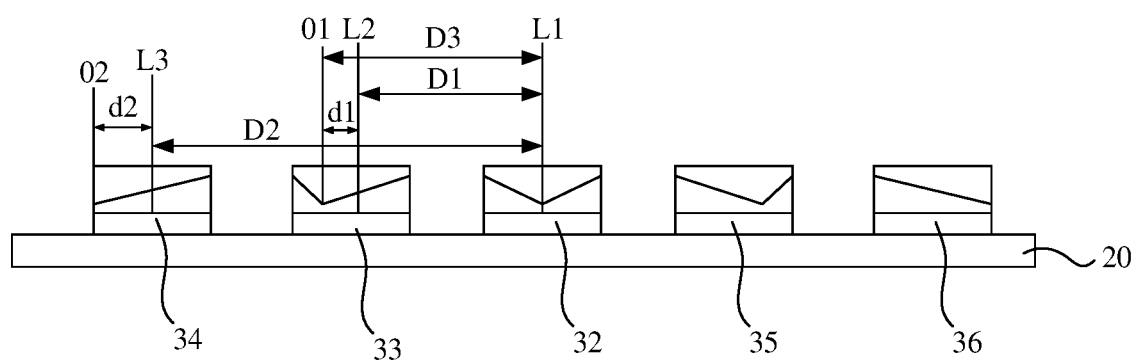
FIG. 6 is a schematic diagram of cooperation between a tapered tip of a reflective film of a light source member and a center line of the light source member according to an embodiment of this application.

The five light source members shown in FIG. 6 are light source members in a middle row of one light emitting region 21 shown in FIG. 4. To facilitate description, the five light source members are separately named a first light source member 32, a second light source member 33, a third light source member 34, a fourth light source member 35, and a fifth light source member 36. The first light source member 32 is located at a center point of the light emitting region. In a direction away from the center point of the light emitting region, the second light source member 33 and the third light source member 34 are arranged on one side of the first light source member 32, and the fourth light source member 35 and the fifth light source member 36 are arranged on the other side of the first light source member 32. A distance between the second light source member 33 and the center point of the light emitting region and a distance between the fourth light source member 35 and the center point of the light emitting region each are D1. A distance between the third light source member 34 and the center point of the light emitting region and a distance between the fifth light source member 36 and the center point of the light emitting region each are D2. In addition, D2>D1. The distance between the light source member to the center point of the light emitting region means a minimum distance between the center line of the light source member and the center point of the light emitting region.

The second light source member 33 and the third light source member 34 are used as an example. A tapered tip of the first light source member 32 is located on a center line L1 of the first light source member 32. The center line L1 passes through the center point of the light emitting region. A distance between a straight line in which a tapered tip O1 of the second light source member 33 is located and that runs through a substrate in a thickness direction of the substrate and a center line L2 (the center line L2 also runs through the substrate in the thickness direction of the substrate) of the second light source member 33 is d1. A distance between a straight line in which a tapered tip O2 of the third light source member 34 is located and that runs through the substrate in the thickness direction of the substrate and a center line L3 (the center line L3 also runs through the substrate in the thickness direction of the substrate) of the third light source member 34 is d2. In addition, d1<d2. It can be seen that, the distance between the center line of a corresponding light source member and the straight line in which the tapered tip of the reflective film is located and that runs through the substrate in the thickness direction of the substrate gradually increases as the distance between the light source member and the center point of the light emitting region increases.

Still refer to FIG. 6. When a light emitting unit and a reflective film of each light source member are disposed, a first distance D3 needs to be greater than a second distance D1 (using the second light source member 33 as an example, the first distance is D3, and the second distance is D1). The first distance D3 is a distance between the center line of the light emitting region and the straight line in which the tapered tip of the reflective film is located and that runs through the substrate in the thickness direction of the substrate. The second distance D1 is a distance between the center line of the light emitting region and the center line of the light emitting unit corresponding to the reflective film. It can be learned from FIG. 6 that D3=D1+d2.

Refer to the structure shown in FIG. 5. The straight line in which the tapered tip is located and that runs through the corresponding light emitting unit in the thickness direction of the substrate divides reflected light into different directions. A part of the tapered surface that is located at the tapered tip and is close to the center point of the light emitting region may reflect light emitted by the light emitting unit towards a central position of the light emitting region. A part of the tapered surface that is located at the tapered tip and is away from the center point of the light emitting region may reflect the light emitted by the light emitting unit to the central position away from the light emitting region. Therefore, in the solution in this embodiment of this application, when the corresponding first distance gradually increases as the distance between the light source member and the center point of the light emitting region gradually increases, the light source member away from the center point of the light emitting region is enabled to reflect more light to the center of the light emitting region. In addition, for reflective films of light source members (the third light source member 34 and the fifth light source member 36) located at an edge of the light emitting region, straight lines in which tapered tips are located and that run through corresponding light emitting units in the thickness direction of the substrate are located at the edges of the light source members. In this way, emitted light is emitted towards the central region of the light emitting region, and light emitted to an adjacent light emitting region is minimized.

Figure 7:
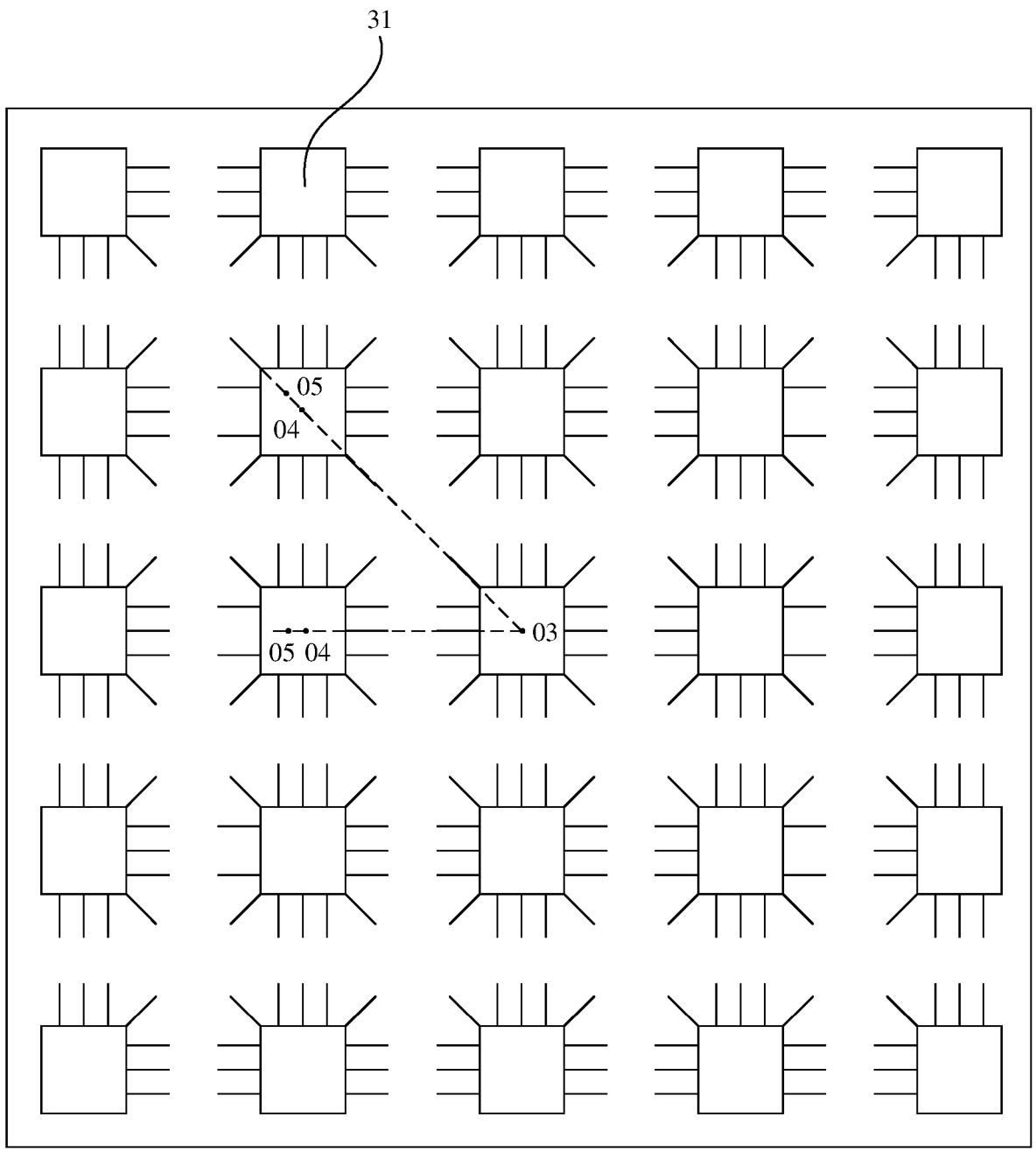
FIG. 7 is a schematic diagram of cooperation among a center point of a light source member, a tapered tip of a reflective film, and a center point of a light emitting region according to an embodiment of this application.

Refer to a relationship between a light splitting amount of a light source member 31 in a light emitting region and a position of the light source member 31 in FIG. 7. When the light source member 31 performs light splitting, a light splitting effect is set in a divergence manner by using a center point of the light emitting region as a center. In FIG. 7, a point O3 is the center point of the light emitting region, a point O4 is a center line of each light source member 31, and a point O5 is a tapered tip of a reflective film of each light source member 31. It can be learned from a top view in FIG. 7 that the point O3, the point O4, and the point O5 are in a same straight line. In a three-dimensional structure, a connection line between a projection of the tapered tip of the reflective film in a first plane and a projection of the center of the light emitting region in the first plane is a first connection line. A center line of the light emitting unit corresponding to the reflective film intersects with the first connection line. It should be noted that the first plane is a plane parallel to an upper surface or a lower surface of the substrate, the upper surface of the substrate is a surface on which a light source assembly is disposed, and the lower surface of the substrate is away from the upper surface of the substrate. It can be seen from FIG. 7 that, for light source members 31 in a same row, in a same column, or arranged in an oblique row, in a direction away from the center point O3 of the light emitting region, a projection of the tapered tip O5 of the reflective film in the first plane is farther from a projection of the center point O3 of the light emitting region in the first plane than the center line (the point O4) of a corresponding light source member 31. In this way, the light emitting region of the light source member 31 faces an edge of the light emitting region or faces an inside of the light emitting region, so that light is not diverged into an adjacent light emitting region.

It can be learned from the foregoing description that, in the backlight module provided in this embodiment of this application, light source members in different light emitting directions are arranged in the light emitting region based on a design requirement. A light source member in a center of the light emitting region emits light around. In this way, a light source member at an edge of the light emitting region emits light towards the inside of the light emitting region. This implements uniform light mixing and suppresses light crosstalk between light emitting regions.

Figure 8:
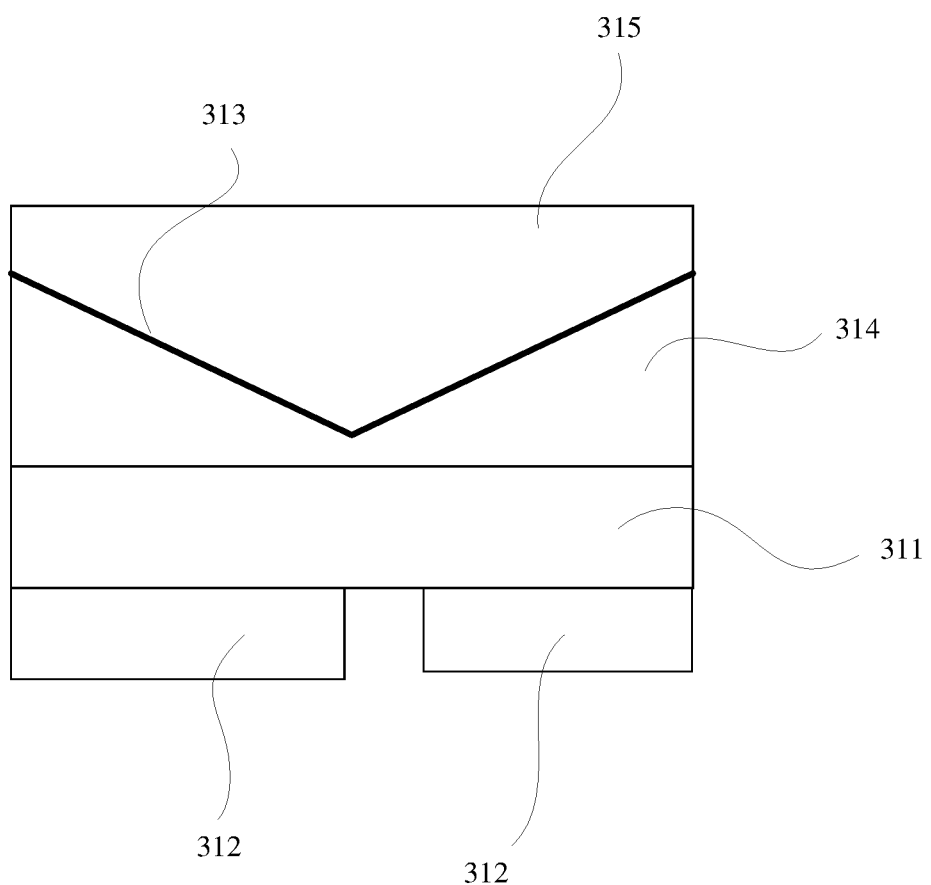
FIG. 8 is a schematic diagram of a structure of a light source member according to an embodiment of this application.

FIG. 8 is a schematic diagram of a structure of a light source member 31 according to an embodiment of this application. The light source member 31 includes a light emitting unit 311 and a reflective film 313. For a structure of the light emitting unit 311, refer to the related description in FIG. 5. When the reflective film 313 is connected to the light emitting unit 311, the reflective film 313 is bonded to a top light emitting surface of the light emitting unit 311 by using a first optical adhesive layer 314. For example, the first optical adhesive layer 314 is a transparent adhesive layer, to ensure that light emitted by the top light emitting surface of the light emitting unit 311 can pass through the first optical adhesive layer.

As an optional solution, to facilitate production of the light source member 31, the light source member 31 further includes a flat layer 315 that covers the reflective film 313. In this way, a flat plane is formed on a top of the light source member 31, to facilitate capturing by using a capturing device after production is complete.

When the foregoing structure is used, the flat layer 315 may be a second optical adhesive layer, and the reflective film 313 may be a plating layer coated between the first optical adhesive layer and the second optical adhesive layer. For example, the plating layer may be a coating that has a high reflection effect, such as an aluminum plating layer or a silver plating layer.

During specific preparation, an LED process is first completed on a sapphire substrate to form a light emitting unit, and then a transparent adhesive 314 is formed on the light emitting unit 311. A microstructure is prepared on the transparent adhesive 314. A shape of the microstructure corresponds to a shape, for example, a conical shape, of the reflective film 313. After the microstructure is prepared, a reflective metal (Al or Ag) is vapor-plated on an entire surface of the microstructure to form the reflective film 313. Then, a flat layer is prepared, and an outermost surface of the flat layer is smoothed, to facilitate a capturing device to capture a light source member.

Figure 9:
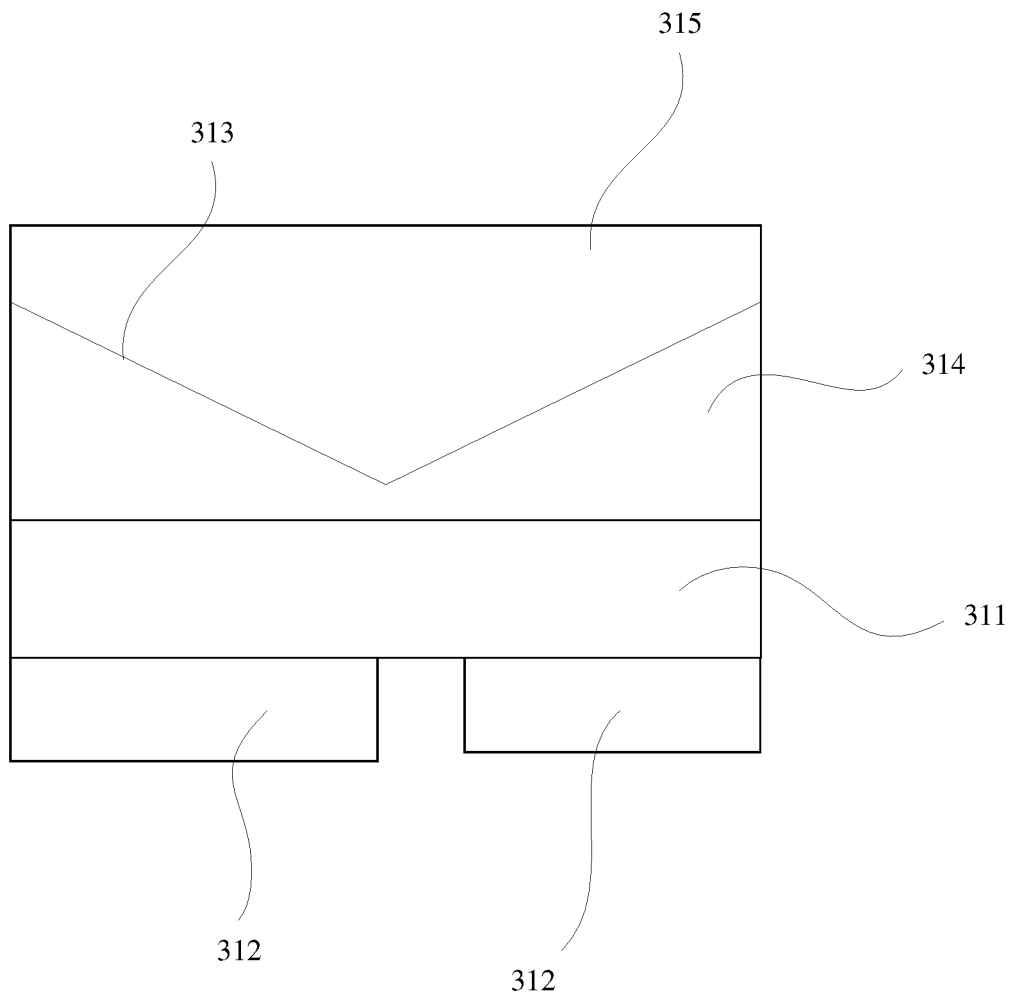
FIG. 9 is a schematic diagram of a structure of another light source member according to an embodiment of this application.

FIG. 9 is a schematic diagram of a structure of another light source member 31. The light source member 31 includes a light emitting unit 311, a first optical adhesive layer 314, and a flat layer 315. The first optical adhesive layer 314 is connected to a top light emitting surface of the light emitting unit 311. A tapered hole corresponding to a reflective film is formed on the first optical adhesive layer 314. The flat layer 315 is filled in the tapered hole. The flat layer 315 uses reflective white adhesive. The reflective white adhesive can reflect light. Therefore, a surface that is of the flat layer 315 and is in contact with the first optical adhesive layer 314 may be used as a reflective film. This simplifies a structure of the light source member 31. The reflective film may be formed when the flat layer 315 is prepared and formed.

Figure 10:
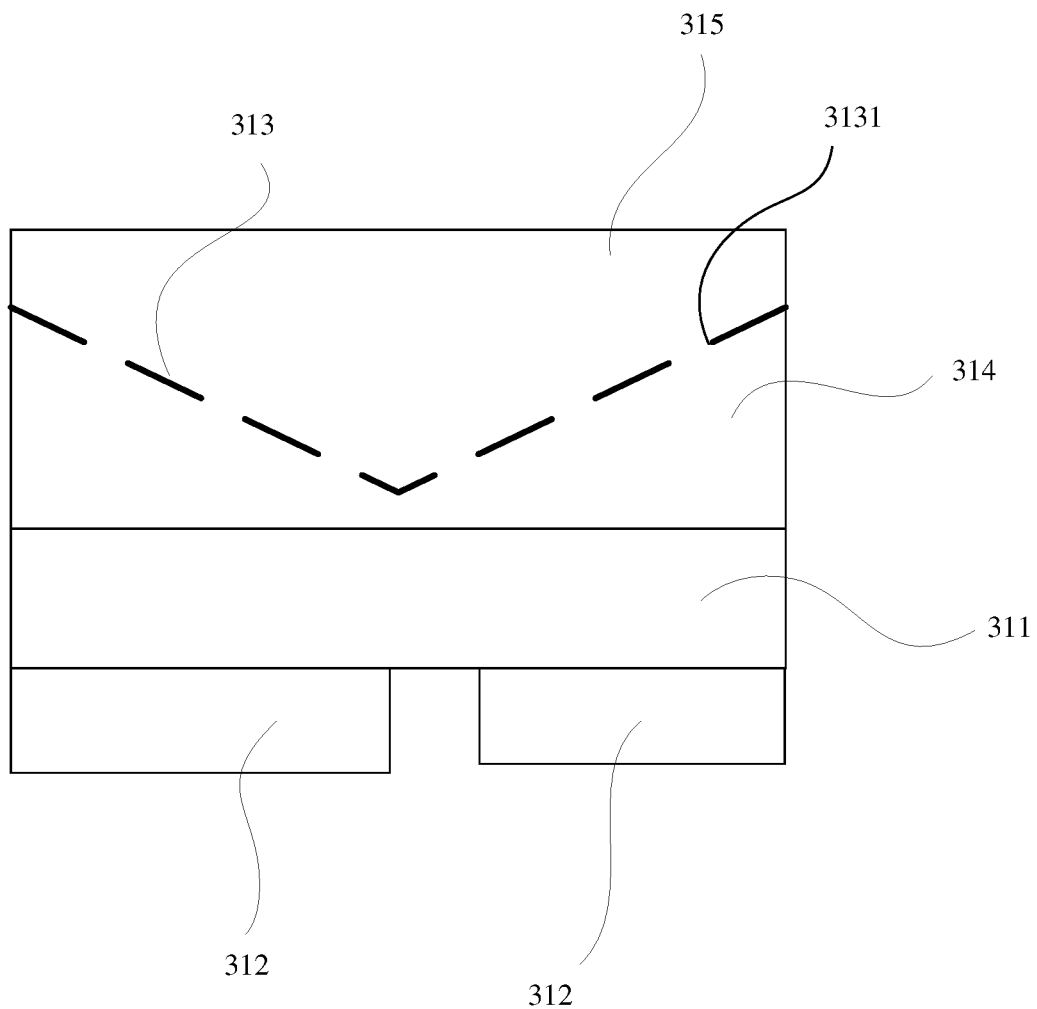
FIG. 10 is a schematic diagram of a structure of another light source member according to an embodiment of this application.

FIG. 10 is a variation of the light source member shown in FIG. 8 or FIG. 9. A light transmission hole 3131 is added based on the reflective film 313 shown in FIG. 8 or FIG. 9. When the reflective film 313 is a plating layer coated on the first optical adhesive layer 314, and the flat layer 315 is a second optical adhesive layer, the light transmission hole 3131 may be a hole opened in the plating layer. When the reflective film 313 is a surface of the reflective white adhesive, the light transmission hole 3131 is a through hole that penetrates through the flat layer 315. When light emitted by the light emitting unit 311 is illuminated to the reflective film 313, a part of the light may pass through the light transmission hole 3131, and a part of the light may be reflected by the reflective film 313. It can be seen from the foregoing description that the light transmission hole 3131 is also a light splitting manner of the reflective film 313. Light may be split in different directions by using the reflective film 313.

As an optional solution, a plurality of light transmission holes 3131 may be uniformly arranged in the reflective film 313, or may be disposed, based on a light mixing requirement, in the reflective film 313 in another arrangement manner.

An embodiment of this application further provides a display screen. The display screen includes the backlight module according to any one of the foregoing implementations, and a liquid crystal layer and the backlight module are stacked. Light splitting is performed by using a reflective film. A proportion of light split by the reflective film towards a center of a light emitting region gradually increases in a direction from the center to an edge of the light emitting region in which a light source member is located. In this way, light emitted by the light source assembly has good light mixing effect in the light emitting region. This improves light emitting effect of the backlight module. In addition, light splitting is performed by using the reflective film, facilitating miniaturization of the backlight module.

An embodiment of this application further provides a display apparatus. The display apparatus includes the backlight module according to any one of the foregoing implementations, and a liquid crystal layer and the backlight module are stacked. Light splitting is performed by using a reflective film. A proportion of light split by the reflective film towards a center of a light emitting region gradually increases in a direction from the center to an edge of the light emitting region in which a light source member is located. In this way, light emitted by the light source assembly has good light mixing effect in the light emitting region. This improves light emitting effect of the backlight module. In addition, light splitting is performed by using the reflective film, facilitating miniaturization of the backlight module.

It is clearly that a person skilled in the art can make various modifications and variations to this application without departing from the spirit and scope of this application. This application is intended to cover these modifications and variations of this application provided that they fall within the scope of protection defined by the following claims and their equivalent technologies.

What is claimed is:

1. A backlight module, comprising:
   a substrate, comprising a plurality of light emitting regions arranged in an array; and
   a plurality of light source assemblies disposed in the plurality of light emitting regions in a one-to-one correspondence;
   wherein each light source assembly of the plurality of light source assemblies comprises a plurality of light source members arranged in an array, and each light source member comprises a light emitting unit and a reflective film configured to split light emitted by the respective light emitting unit; and
   wherein each light source assembly is configured in a manner that a proportion of light split by the reflective films of the corresponding light source members towards a center of the corresponding light emitting region gradually increases in a direction from the center to an edge of the corresponding light emitting region in which the corresponding light source members are located.

2. The backlight module according to claim 1, wherein for each light emitting unit:
   the corresponding reflective film is located on a light emitting side of the respective light emitting unit, the corresponding reflective film faces a top light emitting surface of the respective light emitting unit, and the corresponding reflective film is configured to split light emitted from a top of the respective light emitting unit.

3. The backlight module according to claim 2, wherein for each reflective film:
   the respective reflective film is a tapered surface, a tapered tip of the respective reflective film faces the top light emitting surface of the corresponding light emitting unit; and
   wherein each light source assembly is configured in a manner that a distance between center lines of the corresponding light emitting units and a straight line in which the tapered tips of the reflective films are located and that runs through the substrate in a thickness direction of the substrate gradually increases in a direction away from the center of the corresponding light emitting region, and wherein the center lines of the corresponding light emitting units are straight lines that run through the centers of the corresponding light emitting units in the thickness direction of the substrate.

4. The backlight module according to claim 3, wherein for each reflective film:
   a distance between a center line of the corresponding light emitting region and the straight line in which the tapered tip of the respective reflective film is located and that runs through the substrate in the thickness direction of the substrate is a first distance, and a distance between the center line of the corresponding light emitting region and the center line of the light emitting unit corresponding to the respective reflective film is a second distance, the first distance is greater than the second distance, wherein the center line of the corresponding light emitting region is a straight line that runs through the center of the corresponding light emitting region in the thickness direction of the substrate.

5. The backlight module according to claim 4, wherein for each reflective film:
   a connection line between a projection of the tapered tip of the respective reflective film in a first plane and a projection of the center of the corresponding light emitting region in the first plane is a first connection line, and the center line of the light emitting unit corresponding to the respective reflective film intersects with the first connection line, and the first plane is parallel to a surface of the substrate.

6. The backlight module according to claim 1, wherein a plurality of light transmission holes extend in the reflective films.

7. The backlight module according to claim 6, wherein the plurality of light transmission holes are uniformly arranged in the reflective films.

8. The backlight module according to claim 1, wherein each reflective film is bonded to the top light emitting surface of the corresponding light emitting unit by using a transparent adhesive.

9. The backlight module according to claim 1, wherein each light source member further comprises a flat layer that covers the corresponding reflective film.

10. The backlight module according to claim 1, further comprising:
    a diffusion film and a prism brightness enhancement film, wherein the diffusion film and the prism brightness enhancement film are disposed in a stacked manner, and the diffusion film is closer to the plurality of light source assemblies than the prism brightness enhancement film.

11. The backlight module according to claim 1, wherein each light emitting region is in a one-to-one correspondence with a display region of a display layer of a display screen.

12. A display screen, comprising:
    backlight module; and
    a liquid crystal layer, wherein the backlight module and the liquid crystal layer are stacked;
    wherein the backlight module, comprises:
        a substrate, comprising a plurality of light emitting regions arranged in an array; and
        a plurality of light source assemblies disposed in the plurality of light emitting regions in a one-to-one correspondence;
    wherein each light source assembly of the plurality of light source assemblies comprises a plurality of light source members arranged in an array, and each light source member comprises a light emitting unit and a reflective film configured to split light emitted by the respective light emitting unit; and
    wherein each light source assembly is configured in a manner that a proportion of light split by the reflective films of the corresponding light source members towards a center of the corresponding light emitting region gradually increases in a direction from the center to an edge of the corresponding light emitting region in which the corresponding light source members are located.

13. The display screen according to claim 12, wherein for each light emitting unit:
    the corresponding reflective film is located on a light emitting side of the respective light emitting unit, the corresponding reflective film faces a top light emitting surface of the respective light emitting unit, and the corresponding reflective film is configured to split light emitted from a top of the respective light emitting unit.

14. The display screen according to claim 13, wherein for each reflective film:
the respective reflective film is a tapered surface, and a tapered tip of the respective reflective film faces the top light emitting surface of the corresponding light emitting unit; and
wherein each light source assembly is configured in a manner that a distance between center lines of the corresponding light emitting units and a straight line in which the tapered tips of the reflective films are located and that runs through the substrate in a thickness direction of the substrate gradually increases in a direction away from the center of the corresponding light emitting region, and wherein the center lines of the corresponding light emitting units are straight lines that run through the centers of the corresponding light emitting units in the thickness direction of the substrate.

15. The display screen according to claim 14, wherein for each reflective film:
a distance between a center line of the corresponding light emitting region and the straight line in which the tapered tip of the respective reflective film is located and that runs through the substrate in the thickness direction of the substrate is a first distance, and a distance between the center line of the corresponding light emitting region and the center line of the light emitting unit corresponding to the respective reflective film is a second distance, the first distance is greater than the second distance, wherein the center line of the corresponding light emitting region is a straight line that runs through the center of the corresponding light emitting region in the thickness direction of the substrate.

16. The display screen according to claim 15, wherein for each reflective film:
a connection line between a projection of the tapered tip of the respective reflective film in a first plane and a projection of the center of the corresponding light emitting region in the first plane is a first connection line, and the center line of the light emitting unit corresponding to the respective reflective film intersects with the first connection line, and the first plane is parallel to a surface of the substrate.

17. The display screen according to claim 12, wherein a plurality of light transmission holes extend in the reflective films.

18. The display screen according to claim 17, wherein the plurality of light transmission holes are uniformly arranged in the reflective films.

19. The display screen according to claim 12, wherein each reflective film is bonded to the top light emitting surface of the corresponding light emitting unit by using a transparent adhesive.

20. The display screen according to claim 12, wherein each light source member further comprises a flat layer that covers the corresponding reflective film.

* * * * *